US012610835B2

(12) United States Patent (10) Patent No.: US 12,610,835 B2
Ling et al. (45) Date of Patent: Apr. 21, 2026

(54) INTERPOSER SUBSTRATE, PACKAGE STRUCTURE AND MANUFACTURING METHOD OF PACKAGE STRUCTURE

(71) Applicant: Taiwan Semiconductor Manufacturing Company, Ltd., Hsinchu (TW)

(72) Inventors: Chia-Yu Ling, Hsinchu City (TW); Hsin-Yu Lai, Hsinchu (TW); Katherine H Chiang, New Taipei City (TW); Chung-Te Lin, Tainan City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 686 days.

(21) Appl. No.: 17/896,083

(22) Filed: Aug. 26, 2022

(65) Prior Publication Data

US 2024/0071936 A1 Feb. 29, 2024

(51) Int. Cl.
| | |
|---|---|
| *H01L 23/538* | (2006.01) |
| *H01L 21/48* | (2006.01) |
| *H01L 23/00* | (2006.01) |
| *H01L 23/498* | (2006.01) |
| *H01L 25/16* | (2023.01) |

(52) U.S. Cl.
CPC ...... *H01L 23/5381* (2013.01); *H01L 21/4853* (2013.01); *H01L 21/4857* (2013.01); *H01L 21/486* (2013.01); *H01L 23/49816* (2013.01);

*H01L 23/49822* (2013.01); *H01L 23/49833* (2013.01); *H01L 23/49838* (2013.01); *H01L 23/5385* (2013.01); *H01L 23/5386* (2013.01); *H01L 24/16* (2013.01); *H01L 25/162* (2013.01); *H01L 2224/16225* (2013.01); *H01L 2924/1431* (2013.01); *H01L 2924/1436* (2013.01); *H01L 2924/1443* (2013.01)

(58) Field of Classification Search
CPC . H01L 23/5381; H01L 25/18; H01L 25/0655; H01L 25/0652
See application file for complete search history.

(56) References Cited

U.S. PATENT DOCUMENTS

| | | | | |
|---|---|---|---|---|
| 2020/0075567 A1* | 3/2020 | Collins | ............... | H01L 21/4857 |
| 2020/0243497 A1* | 7/2020 | Hsu | ...................... | H01L 21/4857 |
| 2021/0202392 A1* | 7/2021 | Kung | .................... | H01L 25/105 |
| 2021/0366889 A1* | 11/2021 | Lin | ......................... | H01L 25/18 |
| 2022/0157689 A1* | 5/2022 | Chen | .................... | H01L 23/552 |
| 2023/0005819 A1* | 1/2023 | Olson | ................. | H01L 23/5385 |

* cited by examiner

*Primary Examiner* — Michele Fan
(74) *Attorney, Agent, or Firm* — JCIPRNET

(57) ABSTRACT

Disclosed are an interposer substrate, a package structure and a manufacturing method of a package structure. In one embodiment, the interposer substrate includes a substrate, a bridge device in the substrate, a memory in the substrate and beside the bridge device and a through substrate via in the substrate and beside the bridge device and the memory.

20 Claims, 17 Drawing Sheets

INTERPOSER SUBSTRATE, PACKAGE STRUCTURE AND MANUFACTURING METHOD OF PACKAGE STRUCTURE

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As the demand for miniaturization, higher speed and greater bandwidth, as well as lower power consumption and latency has grown recently, a need for semiconductor elements to provide more functions has grown.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION

Figure 1:
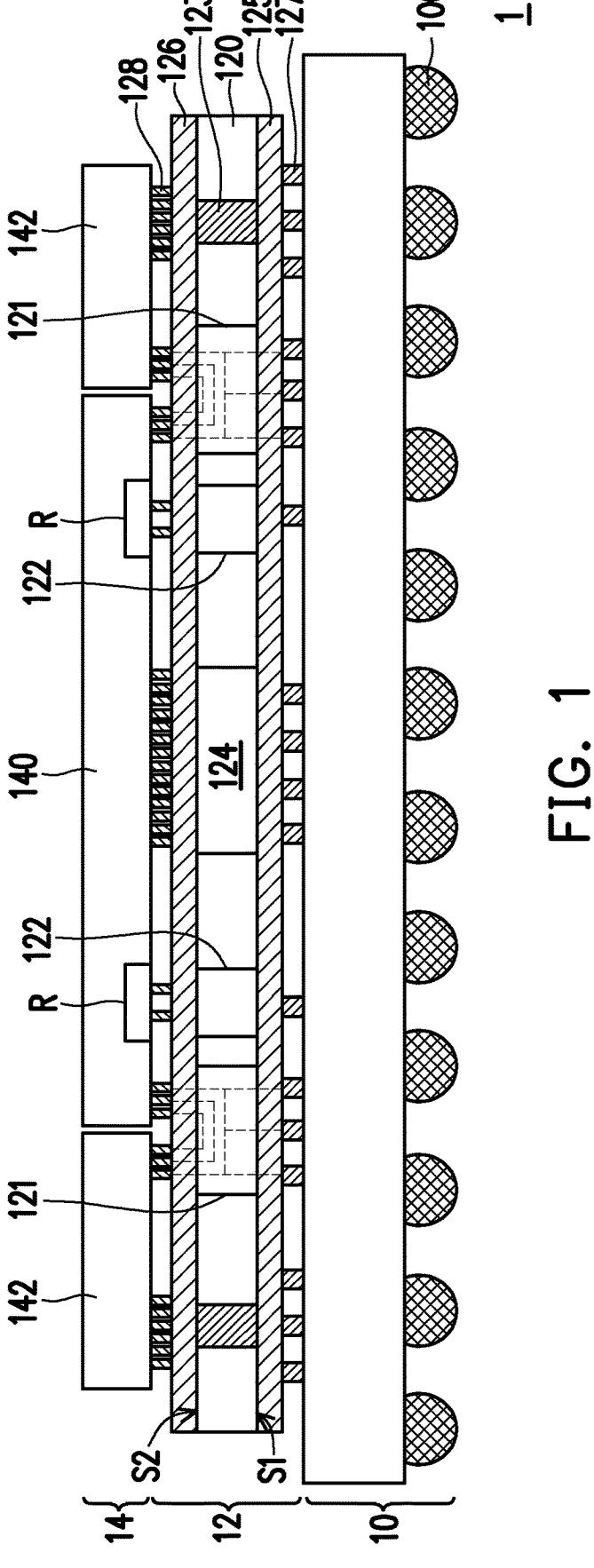
FIG. 1 schematically illustrates a cross-sectional view of a package structure in accordance with some embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Interposer substrates have been used for electrical connection between different semiconductor dies and/or between the semiconductor dies and the circuit substrate. In some cases, passive components, such as integrated passive devices (IPD), have been embedded in interposer substrates to enhance electrical performance, such as providing high density capacitors and/or low effective series inductance (ESL). However, a need for interposer substrates to provide more functions has grown.

The present disclosure is related to an interposer substrate, a package structure and a manufacturing method of a package structure. In some embodiments, the interposer substrate is provided with a memory to provide more functions and/or to reduce memory footprint in chip area. The memory can be disposed under a core region of a control circuit die, such as a system-on-chip (SoC) die or a system-on-integrated-chip (SoIC) die, to decrease the signal transfer distance, power consumption and/or latency. Since the memory is inside the interposer substrate, the memory capacity can be tuned to application requirement without footprint penalty.

FIG. 1 schematically illustrates a cross-sectional view of a package structure in accordance with some embodiments of the present disclosure. FIG. 2A through FIG. 2H schematically illustrate a partial process flow for manufacturing a package structure in accordance with some embodiments of the present disclosure. FIG. 3A through FIG. 3E schematically illustrate another process flow for manufacturing a package structure in accordance with some alternative embodiments of the present disclosure. FIG. 4A through FIG. 4C schematically illustrate yet another partial process flow for manufacturing a package structure in accordance with other alternative embodiments of the present disclosure.

Referring to FIG. 1, a package structure 1 in accordance with some embodiments of the present disclosure is provided. The package structure 1 may be a chip-on-wafer-on-substrate (CoWoS) package structure, but not limited thereto. The package structure 1 may include a wiring substrate 10, an interposer substrate 12 bonded and electrically connected to the wiring substrate 10 and a plurality of semiconductor dies 14 bonded and electrically connected to the interposer substrate 12.

In some embodiments, the wiring substrate 10 is a printed circuit board. In some embodiments, although not shown, the wiring substrate 10 includes a dielectric core layer, build-up or laminated dielectric layers stacked over opposite surfaces of the dielectric core layer, conductive wiring layers embedded in the build-up or laminated dielectric layers, conductive vias penetrating through the dielectric core layer and the build-up or laminated dielectric layers and conductive terminals 100 formed on a lower surface of the wiring substrate 10 and electrically connected to the bottommost conductive wiring layer of the wiring substrate 10. The conductive terminals 100 may be, for example, contact bumps or solder balls, although any suitable types of conductive terminals may be utilized.

The interposer substrate 12 is disposed and electrically connected between the wiring substrate 10 and the plurality of semiconductor dies 14. The interposer substrate 12 may include a substrate 120, a bridge device 121 in the substrate 120, a memory 122 in the substrate 120 and beside the bridge device 121 and a through substrate via 123 in the substrate 120 and beside the bridge device 121 and the memory 122, but not limited thereto. In some embodiments, more than one bridge devices 121, more than one memory 122 and more than one through substrate vias 123 are in the substrate 120. In some embodiments, the interposer substrate 12 further includes an integrated passive device 124 in the substrate 120 and beside the bridge device 121, the memory 122 and the through substrate via 123. In some embodiments, the interposer substrate 12 further includes a first redistribution circuit structure 125 and a second redistribution circuit structure 126 respectively disposed on opposite surfaces of the substrate 120, wherein the first redistribution circuit structure 125 and the second redistribution circuit structure 126 are electrically connected to the bridge device 121, the memory 122, the through substrate via 123 and the integrated passive device 124 (if existed).

In some embodiments, the substrate 120, the bridge device 121, the memory 122, the through substrate via 123 and the integrated passive device 124 (if existed) have the same thickness, wherein the substrate 120 surrounds the bridge device 121, the memory 122, the through substrate via 123 and the integrated passive device 124 (if existed) and exposes upper surface and lower surface of each of the bridge device 121, the memory 122, the through substrate via 123 and the integrated passive device 124 (if existed).

The substrate 120 has a first surface S1 that faces the wiring substrate 10 and a second surface S2 that faces the plurality of semiconductor dies 14. In some embodiments, upper surfaces of the bridge device 121, the memory 122, the through substrate via 123 and the integrated passive device 124 (if existed) are coplanar or level with the second surface S2 of the substrate 120, and lower surfaces of the bridge device 121, the memory 122, the through substrate via 123 and the integrated passive device 124 (if existed) are coplanar or level with the first surface S1 of the substrate 120.

In some embodiments, a material of the substrate 120 includes a molding compound, a molding underfill, a resin or a combination thereof. For example, the bridge device 121, the memory 122 and the integrated passive device 124 (if existed) are dies or chips, and the dies or chips are molded together by the substrate 120. In some alternative embodiments, a material of the substrate 120 includes a dielectric material. For example, although not shown in FIG. 1, the substrate 120 may be a stack of a plurality of dielectric layers, and the substrate 120 may be a portion of each of the bridge device 121, the memory 122 and the integrated passive device 124 (if existed), i.e., the bridge device 121/the memory 122/the integrated passive device 124 and the substrate 120 may share the same dielectric layers, detail description will be provided later.

The bridge device 121 is configured for electrical connection (see the dash lines) between adjacent semiconductor dies 14 and/or between the semiconductor dies 14 and the wiring substrate 10. For example, the bridge device 121 is electrically connected to the semiconductor dies 14 through the first redistribution circuit structure 125, and the bridge device 121 is electrically connected to the wiring substrate 10 through the second redistribution circuit structure 126. In some embodiments, the bridge device 121 includes a large scale integration (LSI) circuit or a large scale integration die, but not limited thereto.

The memory 122 is configured for data storage. For example, the memory 122 is electrically connected to a corresponding semiconductor die 14 (e.g., a system-on-chip die 140) through the first redistribution circuit structure 125, and the memory 122 is electrically connected to the wiring substrate 10 through the second redistribution circuit structure 126. In some embodiments, the memory 122 includes any kind of existing memory, such as magnetic random access memory (MRAM), resistive random access memory (RRAM), embedded dynamic random access memory (eDRAM) or combination thereof, but not limited thereto.

The through substrate via 123 penetrates through the substrate 120 and electrically connected between the first redistribution circuit structure 125 and the second redistribution circuit structure 126.

The integrated passive device 124 is configured for electrical performance enhancement. For example, the integrated passive device 124 may include resistors, capacitors, inductors or combination thereof, but not limited thereto.

The first redistribution circuit structure 125 is disposed on the first surface S1 of the substrate 120 and between the substrate 120 and the wiring substrate 10. The second redistribution circuit structure 126 is disposed on the second surface S2 of the substrate 120 and between the substrate 120 and the plurality of semiconductor dies 14. Each of the first redistribution circuit structure 125 and the second redistribution circuit structure 126 may be formed of alternating layers of dielectric (e.g., low-k dielectric material) and conductive material (e.g., copper) with vias interconnecting the layers of conductive material and may be formed through any suitable process (such as deposition, damascene, dual damascene, or the like).

In some embodiments, the interposer substrate 12 further includes a plurality of conductive terminals 127 formed on a lower surface of the first redistribution circuit structure 125 and electrically connected to the bottommost conductive wiring layer of the first redistribution circuit structure 125. The conductive terminals 127 may be, for example, ball grid array (BGA) connectors, solder balls, controlled collapse chip connection (C4) bumps, micro bumps, electroless nickel-electroless palladium-immersion gold technique (ENEPIG) formed bumps, or the like, although any suitable types of conductive terminals may be utilized.

In some embodiments, the interposer substrate 12 further includes a plurality of conductive terminals 128 formed on an upper surface of the second redistribution circuit structure 126 and electrically connected to the topmost conductive wiring layer of the second redistribution circuit structure 126. The conductive terminals 128 may be, for example, micro bumps, although any suitable types of conductive terminals may be utilized.

In some embodiments, although not shown, the package structure 1 may further include a first underfill that fills a gap between the interposer substrate 12 and the wiring substrate 10 to encapsulate the conductive terminals 127. The conductive terminals 127 are laterally encapsulated and protected by the first underfill such that damage of the conductive terminals 127 resulted from coefficient of thermal expansion (CTE) mismatch between the interposer substrate 12 and the wiring substrate 10 may be prevented or alleviated. Accordingly, reliability of the conductive terminals 127 may be improved.

Similarly, although not shown, the package structure 1 may further include a second underfill that fills a gap between the interposer substrate 12 and the plurality of semiconductor dies 14 to encapsulate the conductive terminals 128. The conductive terminals 128 are laterally encapsulated and protected by the second underfill such that damage of the conductive terminals 128 resulted from coefficient of thermal expansion (CTE) mismatch between the interposer substrate 12 and the plurality of semiconductor dies 14 may be prevented or alleviated. Accordingly, reliability of the conductive terminals 128 may be improved.

The plurality of semiconductor dies 14 are provided and mounted to the conductive terminals 128 of the interposer substrate 12 such that the plurality of semiconductor dies 14 are electrically connected to the interposer substrate 12.

In some embodiments, the plurality of semiconductor dies 14 include memory, flash, power chip, power module, converter, sensor, logic die and so on that can work in conjunction with other semiconductor elements in order to provide a desired functionality to the user. In some embodiments, the plurality of semiconductor dies 14 include digital dies, analog dies, mixed signal dies, such as application-specific integrated circuit (ASIC) dies, logic dies, sensor dies, other kinds of integrated circuit dies or a combination of the above, but is not limited thereto. In some embodiments, the plurality of semiconductor dies 14 include logic dies, system-on-chip (SoC) dies, high bandwidth memory (HBM) cubes each having stacked memory dies or other suitable semiconductor dies.

For example, the plurality of semiconductor dies 14 may include a system-on-chip die 140 and a memory cube 142. One system-on-chip die 140 and two memory cubes 142 located around the system-on-chip dies 140 are presented in FIG. 1 for illustrative purposes, it is understood that more than one system-on-chip dies 140 and more than one memory cubes 142 can be provided on the interposer substrate 12, and the more than one system-on-chip dies 140 and more than one memory cubes 142 may be arranged according to actual needs. In some embodiments, although not shown, the one or more system-on-chip dies 140 and the one or more memory cubes 142 may be molded together by a molding compound, a molding underfill, a resin or a combination thereof, but not limited thereto.

The bridge device 121 of the interposer substrate 12 may be disposed below and overlap the system-on-chip die 140 and the memory cube 142 and is electrically connected to the system-on-chip die 140, the memory cube 142 and the wiring substrate 10, wherein the system-on-chip die 140 may be electrically connected to the memory cube 142 via the bridge device 121 of the interposer substrate 10.

The memory 122 of the interposer substrate 12 may be disposed below and overlap the system-on-chip die 140 and is electrically connected to the system-on-chip die 140 and the wiring substrate 10. For example, the memory 122 may be disposed below and overlap a core region R of the system-on-chip die 140 to decrease the signal transfer distance, power consumption and/or latency. Since the memory 122 is inside the interposer substrate 12, the interposer substrate 12 can provide more functions than signal transmission, and/or the memory footprint in chip area may be reduced and/or more components may be integrated into the chip area. In addition, the memory capacity of the memory 122 in the interposer substrate 12 can be tuned to application requirement without footprint penalty.

A manufacturing method of a package structure (e.g., the package structure 1 in FIG. 1) in accordance with some embodiments of the present disclosure includes: providing an interposer substrate (e.g., the package structure 1 in FIG. 1); bonding a plurality of semiconductor dies (e.g., the plurality of semiconductor dies 14 in FIG. 1) to the interposer substrate; and bonding the interposer substrate to a wiring substrate (e.g., the wiring substrate 10 in FIG. 1).

Referring to FIG. 2A through FIG. 2H, cross-sectional views of a partial process flow for manufacturing a package structure (e.g., the package structure 1 in FIG. 1) in accordance with some embodiments of the present disclosure is provided. Specifically, FIG. 2A through FIG. 2H schematically illustrate a process flow for providing/manufacturing an interposer substrate (e.g., the interposer substrate 12 in FIG. 1).

Figure 2A:
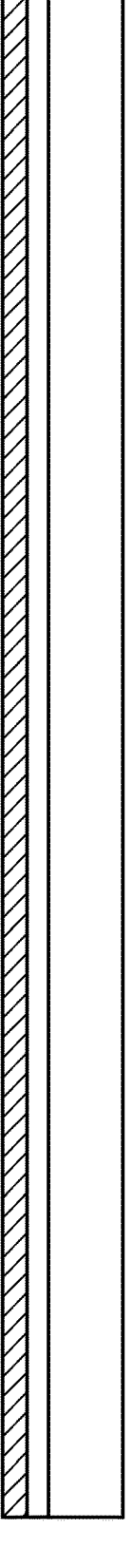
FIG. 2A through FIG. 2H schematically illustrate a partial process flow for manufacturing a package structure in accordance with some embodiments of the present disclosure.

Referring to FIG. 2A, providing the interposer substrate may include forming the first redistribution circuit structure 125 on a carrier CR. The carrier CR may include any suitable material that could provide structural support during semiconductor processing. In some embodiments, the material of the carrier CR includes metal (e.g., steel), glass, ceramic, silicon (e.g., bulk silicon), combinations thereof, multi-layers thereof, or the like, but other materials of the carrier CR are within the contemplated scope of the disclosure. The first redistribution circuit structure 125 may be formed of alternating layers of dielectric (e.g., low-k dielectric material) and conductive material (e.g., copper) with vias interconnecting the layers of conductive material and may be formed through any suitable process (such as deposition, damascene, dual damascene, or the like), as described above. In some embodiments, the material of the wires and the vias includes copper or copper alloy. In some embodiments, the material of the dielectric layers includes silicon oxide, silicon nitride, undoped silicate glass material or a suitable dielectric material.

In some embodiments, a release layer RL is formed on the carrier CR prior to forming the first redistribution circuit structure 125 on the carrier CR for bonding and de-bonding the carrier CR from the first redistribution circuit structure 125. In some embodiments, the release layer RL includes a layer of light-to-heat-conversion (LTHC) release coating and a layer of associated adhesive (such as an ultra-violet (UV) curable adhesive or a heat curable adhesive layer) or the like, but other materials of the release layer RL are within the contemplated scope of the disclosure.

Referring to FIG. 2B through FIG. 2G, providing the interposer substrate may further include forming the substrate 120, the bridge device 121, the memory 122, the through substrate via 123 and the integrated passive device 124 (if existed) on the first redistribution circuit structure 125.

Figure 2B:
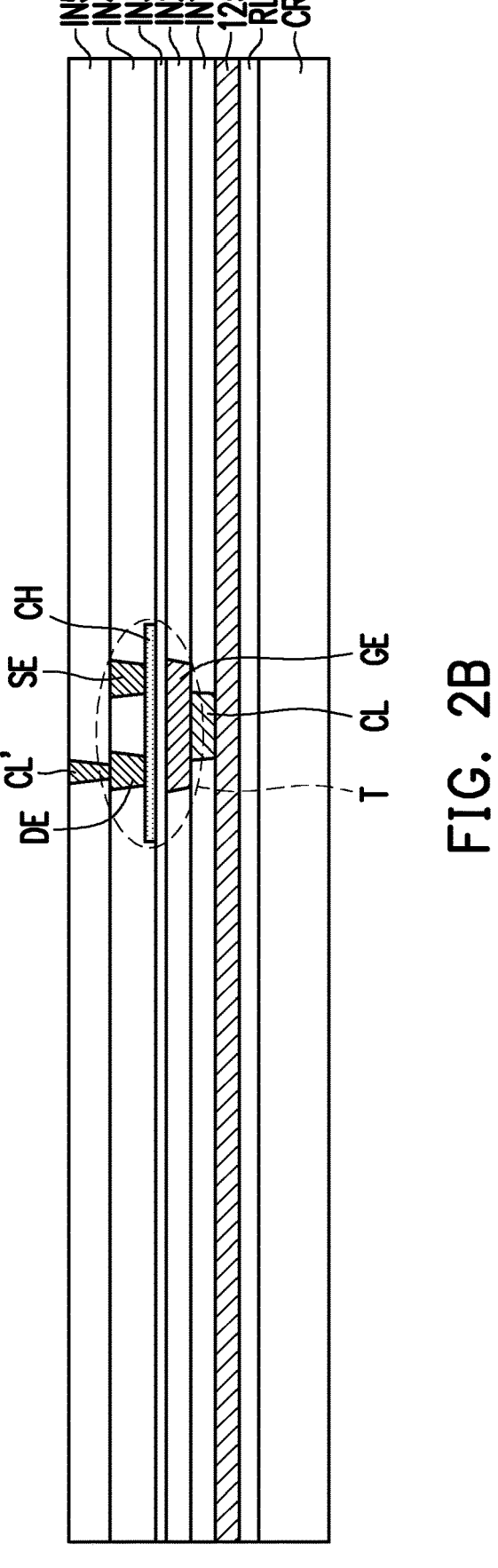

Specifically, as shown in FIG. 2B, a dielectric layer IN1 and a conductive line CL embedded in the dielectric layer IN1 are formed on the first redistribution circuit structure 125. In some embodiments, a material of the dielectric layer IN1 includes polyimide, epoxy resin, acrylic resin, phenol resin, benzocyclobutene (BCB), polybenzooxazole (PBO), or any other suitable polymer-based dielectric material. Alternatively, the material of the dielectric layer IN1 includes oxides or nitrides, such as silicon oxide, silicon nitride, or the like. In some embodiments, the dielectric layer IN1 is formed by suitable fabrication techniques, such as spin-on coating, chemical vapor deposition (CVD), plasma-enhanced chemical vapor deposition (PECVD), or the like.

In some embodiments, a material of the conductive line CL includes a metallic material, such as silver, aluminum, copper, tungsten, nickel, titanium, tantalum, tungsten, zirconium, hafnium, cobalt, alloys thereof, combinations thereof, or the like. In some embodiments, the conductive line CL is formed by the following steps. First, the dielectric layer IN1 is patterned to form an opening (not shown) in the dielectric layer IN1. In some embodiments, the dielectric layer IN1 is patterned through a photolithography process and an etching process. The etching process includes, for example, an anisotropic etching process such as dry etch or an isotropic etching process such as wet etch. After the dielectric layer IN1 is patterned to form the opening, a conductive line material (not shown) is deposited on the patterned dielectric layer IN1 to fill up the opening. In some embodiments, the conductive line material is deposited through atomic layer deposition (ALD), CVD, physical vapor deposition (PVD), plating, or the like. Thereafter, a portion of the conductive line material is removed until the dielectric layer IN1 is exposed, so as to form the conductive line CL having an upper surface that is substantially coplanar with that of the dielectric layer IN1. In some embodiments, the portion of the conductive line material is removed by a mechanical grinding process, a chemical mechanical polishing (CMP) process, or the like. It should be noted that the number of the conductive line CL illustrated in FIG. 2B is merely for illustrative purposes, and the disclosure is not limited thereto. In some alternative embodiments, more conductive lines CL may be formed depending on the circuit design.

A dielectric layer IN2 and a gate electrode GE embedded in the dielectric layer IN2 are formed on the dielectric layer IN1 and the conductive line CL, wherein the gate electrode GE is disposed on and electrically connected to the conductive line CL. The materials and formation methods of the dielectric layer IN2 and the gate electrode GE are respectively similar to that of the dielectric layer IN1 and the conductive line CL, so the detailed descriptions thereof are omitted herein.

A dielectric layer IN3 is formed on the dielectric layer IN2 and the gate electrode GE. The dielectric layer IN3 may be a gate dielectric layer. In some embodiments, a material of the dielectric layer IN3 includes metal oxides, metal nitrides, metal silicates, transition metal-oxides, transition metal-nitrides, transition metal-silicates, oxynitrides of metals, metal aluminates, or combinations thereof. For example, the material of the dielectric layer IN3 includes hafnium oxide (HfO$_2$), hafnium silicon oxide (HfSiO), hafnium silicon oxynitride (HfSiON), hafnium tantalum oxide (HfTaO), hafnium lanthanum oxide (HfLaO), hafnium titanium oxide (HfTiO), hafnium zirconium oxide (HfZrO), zirconium silicate, zirconium aluminate, silicon nitride, silicon oxynitride, zirconium oxide, titanium oxide, aluminum oxide (Al$_2$O$_3$), hafnium dioxide-alumina (HfO$_2$—Al$_2$O$_3$) alloy, and/or combinations thereof. The dielectric layer IN3 may be formed by suitable fabrication techniques such as ALD, CVD, metalorganic CVD (MOCVD), PVD, thermal oxidation, UV-ozone oxidation, remote plasma atomic layer deposition (RPALD), plasma-enhanced atomic layer deposition (PEALD), molecular beam deposition (MBD), or combinations thereof. As illustrated in FIG. 2B, the dielectric layer IN3 may be formed to extend throughout the whole carrier CR. Alternatively, the dielectric layer IN3 may be a patterned layer with one or more dielectric patterns respectively on the one or more gate electrodes GE.

A semiconductor pattern CH is formed on the dielectric layer IN3 and overlapped with the gate electrode GE. In some embodiments, a material of the semiconductor pattern CH includes amorphous oxide semiconductor materials, such as IGZO, InWO, InZnO, InSnO, ZnO, GaOx, InOx, AZO, combinations thereof, or the like, but not limited thereto. In some alternative embodiments, the material of the semiconductor pattern CH includes a single or composite film of HfO$_2$, Hr$_{1-x}$Zr$_x$O$_2$, ZrO$_2$, TiO$_2$, NiO, TaO$_x$, Cu$_2$O, Nb$_2$O$_5$, Al$_2$O$_3$, MoO$_x$, CoO, ZnO, WO$_3$, V$_2$O$_5$, Fe$_3$O$_4$, SrZrO$_3$, SrTiO$_3$, Pr$_{1-x}$Ca$_x$MnO$_3$, La$_{1-x}$Ca$_x$MnO, or the like. In some embodiments, the semiconductor pattern CH is formed by the following steps. First, a semiconductor layer (not shown) is formed on the dielectric layer IN3 by a suitable deposition process, such as CVD, PECVD, FCVD, HDP-CVD, SACVD, PVD, or ALD. Then, the semiconductor layer is patterned by a photolithography process and an etching process or other suitable processes to formed the semiconductor pattern CH over the gate electrode GE.

A dielectric layer IN4, a source electrode SE embedded in the dielectric layer IN4 and a drain electrode DE embedded in the dielectric layer IN4 are formed on the semiconductor pattern CH and the dielectric layer IN2, wherein the source electrode SE and the drain electrode DE are disposed on the semiconductor pattern CH. The materials and formation methods of the dielectric layer IN4 and the electrodes (including the source electrode SE and the drain electrode DE) are respectively similar to that of the dielectric layer IN1 and the conductive line CL, so the detailed descriptions thereof are omitted herein. After the source electrode SE and the drain electrode DE are formed, a transistor T (e.g., a back-end-of-line (BEOL) transistor) of the memory 122 in FIG. 1 is preliminarily completed.

A dielectric layer IN5 and a conductive line CL' embedded in the dielectric layer IN5 are formed on the dielectric layer IN4, the source electrode SE and the drain electrode DE, wherein the conductive line CL' is disposed on and electrically connected to the drain electrode DE. The materials and formation methods of the dielectric layer IN5 and the conductive line CL' are respectively similar to that of the dielectric layer IN1 and the conductive line CL, so the detailed descriptions thereof are omitted herein.

Figure 2C:
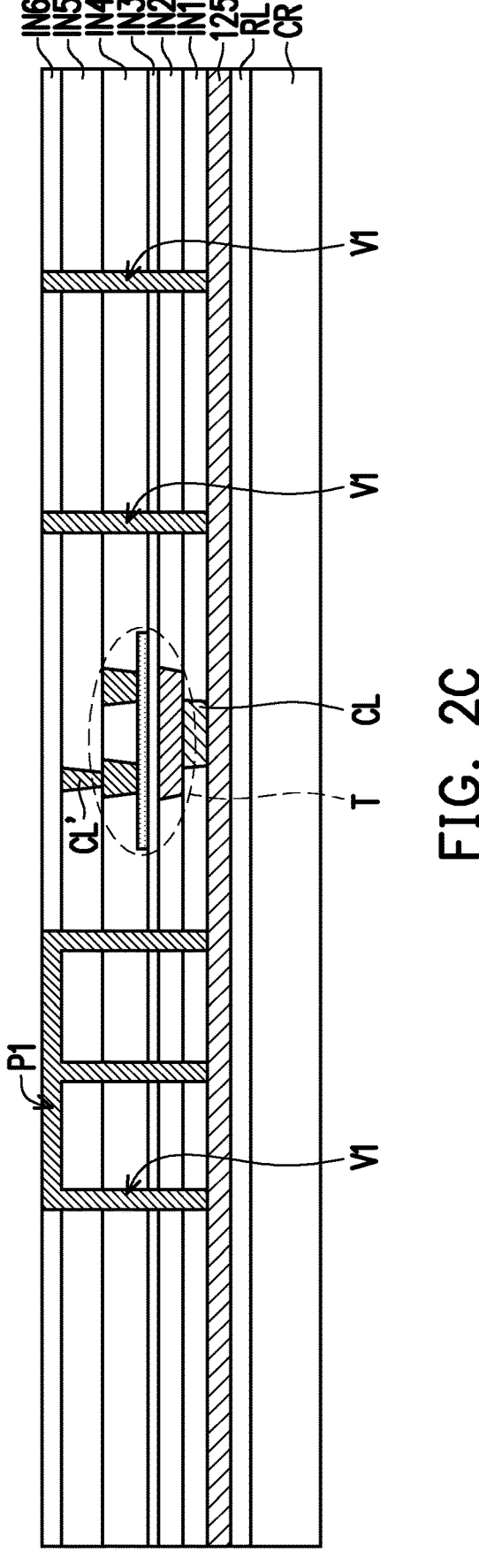

Referring to FIG. 2C, a dielectric layer IN6, a conductive pattern P1 and a plurality of conductive vias V1 are formed. The dielectric layer IN6 is formed on the dielectric layer IN5 and the conductive line CL'. The material and formation method of the dielectric layer IN6 are similar to that of the dielectric layer IN1, so the detailed descriptions thereof are omitted herein. The conductive pattern P1 is embedded in the dielectric layer IN6, while the plurality of conductive vias V1 penetrate through the dielectric layer IN6, the dielectric layer IN5, the dielectric layer IN4, the dielectric layer IN3, the dielectric layer IN2 and the dielectric layer IN1 and electrically connected to the first redistribution circuit structure 125.

In some embodiments, a material of the conductive pattern P1 and the plurality of conductive vias V1 includes aluminum, titanium, copper, nickel, tungsten, or alloys thereof. In some embodiments, the conductive pattern P1 and the plurality of conductive vias V1 are formed simultaneously. In some embodiments, the conductive pattern P1 and the plurality of conductive vias V1 are formed by the following steps. The dielectric layer IN6, the dielectric layer IN5, the dielectric layer IN4, the dielectric layer IN3, the dielectric layer IN2 and the dielectric layer IN1 are patterned through a photolithography process and an etching process to form a plurality of through holes (not shown) to accommodate the plurality of conductive vias V1 subsequently formed thereinto. In addition, the dielectric layer IN6 is patterned through another photolithography process and another etching process to form an opening (not shown) in the dielectric layer IN6 to accommodate the conductive pattern P1 subsequently formed thereinto. The plurality of through holes may be formed prior or subsequent to the opening. After the plurality of through holes and the opening are formed, a conductive material (not shown) is deposited on the patterned dielectric layer IN6 to fill up the plurality of through holes and the opening. In some embodiments, the conductive material is deposited through atomic layer deposition (ALD), CVD, physical vapor deposition (PVD), plating, or the like. Thereafter, a portion of the conductive material is removed by a mechanical grinding process, a chemical mechanical polishing (CMP) process or the like until the dielectric layer IN6 is exposed. Alternatively, the conductive pattern P1 and the plurality of conductive vias V1 may be formed by electroplating, deposition, and/or photolithography and etching. It should be noted that the number of the conductive pattern P1 and the number of the conductive vias V1 illustrated in FIG. 2D are merely for illustrative purposes, and the disclosure is not limited thereto.

Figure 2D:
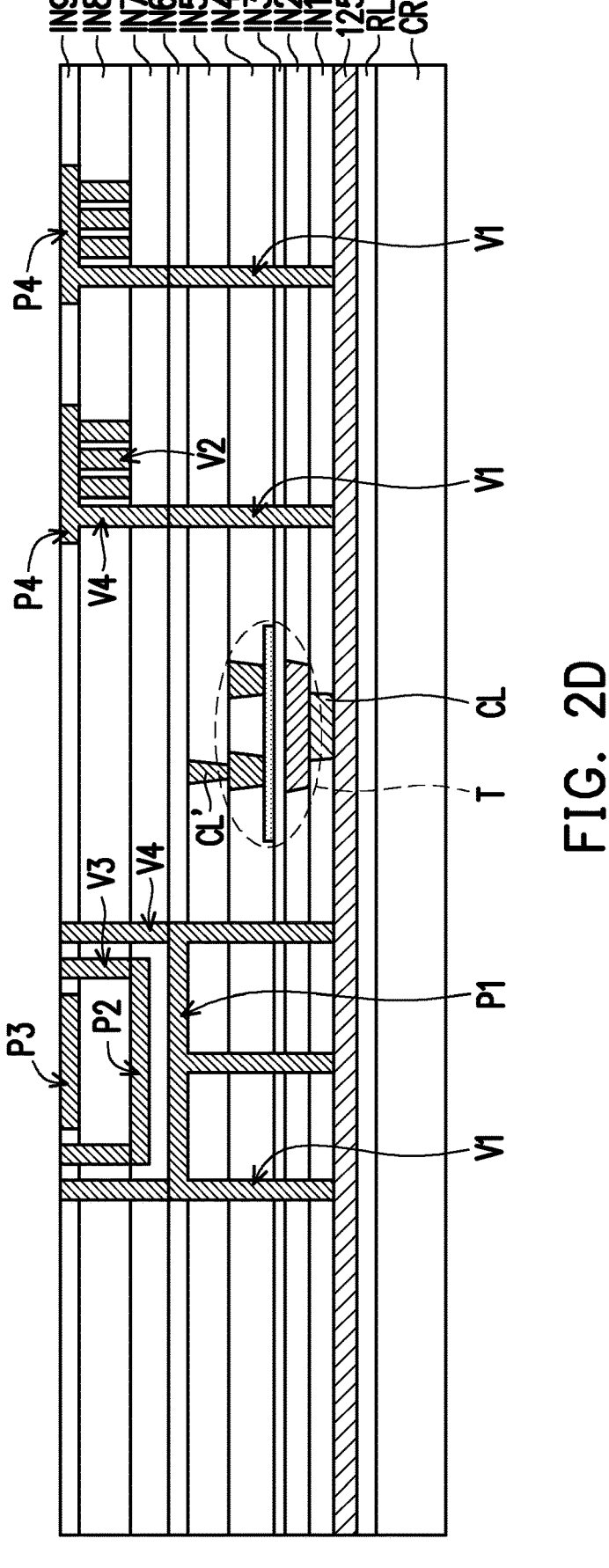

Referring to FIG. 2D, a dielectric layer IN7, a conductive pattern P2, a dielectric layer IN8, a plurality of conductive vias V2, a dielectric layer IN9, a conductive pattern P3, conductive patterns P4, a plurality of conductive vias V3 and a plurality of conductive vias V4 are formed. The dielectric layer IN7 is formed on the dielectric layer IN6, the conductive pattern P1 and the plurality of conductive vias V1. The material and formation method of the dielectric layer IN6 are similar to that of the dielectric layer IN1, so the detailed descriptions thereof are omitted herein.

The conductive pattern P2 is embedded in the dielectric layer IN7 and over the conductive pattern P1, and the conductive pattern P2 is electrically isolated from the conductive pattern P1 via the dielectric layer IN7. In some embodiments, a material of the conductive pattern P2 includes aluminum, titanium, copper, nickel, tungsten, or alloys thereof. In some embodiments, the conductive pattern P2 is formed by the following steps. The dielectric layer IN7 is patterned through a photolithography process and an etching process to form an opening (not shown) in the dielectric layer IN7. Then, a conductive material (not shown) is deposited on the patterned dielectric layer IN7 to fill up the opening. In some embodiments, the conductive material is deposited through atomic layer deposition (ALD), CVD, physical vapor deposition (PVD), plating, or the like. Thereafter, a portion of the conductive material is removed by a mechanical grinding process, a chemical mechanical polishing (CMP) process or the like until the dielectric layer IN7 is exposed. Alternatively, the conductive pattern P2 may be formed by electroplating, deposition, and/or photolithography and etching. It should be noted that the number of the conductive pattern P2 illustrated in FIG. 2D is merely for illustrative purposes, and the disclosure is not limited thereto.

The dielectric layer IN8 is formed on the dielectric layer IN7 and the conductive pattern P2, and the plurality of conductive vias V2 are embedded in the dielectric layer IN8. Materials and formation methods of the dielectric layer IN7 and the plurality of conductive vias V2 are similar to that of the dielectric layer IN1 and the conductive line CL, so the detailed descriptions thereof are omitted herein.

The dielectric layer IN9 is formed on the dielectric layer IN8 and the plurality of conductive vias V2. The material and formation method of the dielectric layer IN9 are similar to that of the dielectric layer IN1, so the detailed descriptions thereof are omitted herein.

The conductive pattern P3 and the conductive patterns P4 are embedded in the dielectric layer IN9, wherein the conductive pattern P3 is over the conductive pattern P2 and electrically isolated from the conductive pattern P2 via the dielectric layer IN8, the conductive patterns P4 are overlapped with and electrically connected to the corresponding conductive vias V2. The plurality of conductive vias V3 penetrate through the dielectric layer IN9 and the dielectric layer IN8 and are connected to the conductive pattern P2, while the plurality of conductive vias V4 penetrate through the dielectric layer IN9, the dielectric layer IN8 and the dielectric layer IN7 and are connected to the plurality of conductive vias V1.

In some embodiments, a material of the conductive pattern P3, the conductive patterns P4, the plurality of conductive vias V3 and the plurality of conductive vias V4 includes aluminum, titanium, copper, nickel, tungsten, or alloys thereof. In some embodiments, the conductive pattern P3, the conductive patterns P4, the plurality of conductive vias V3 and the plurality of conductive vias V4 are formed simultaneously.

In some embodiments, the conductive pattern P3, the conductive patterns P4, the plurality of conductive vias V3 and the plurality of conductive vias V4 are formed by the following steps. The dielectric layer IN9, the dielectric layer IN8 and the dielectric layer IN7 are patterned through a photolithography process and an etching process to form a plurality of first through holes (not shown) to accommodate the plurality of conductive vias V4 subsequently formed thereinto. In addition, the dielectric layer IN9 and the dielectric layer IN8 are patterned through another photolithography process and another etching process to form a plurality of second through holes (not shown) to accommodate the plurality of conductive vias V3 subsequently formed thereinto. Moreover, the dielectric layer IN9 is patterned through yet another photolithography process and yet another etching process to form openings (not shown) in the dielectric layer IN9 to accommodate the conductive pattern P3 and the conductive patterns P4 subsequently formed thereinto. The order in which the plurality of first through holes, the plurality of second through holes and the openings are formed is not limited. Then, a conductive material (not shown) is deposited on the patterned dielectric layer IN9 to fill up the plurality of first through holes, the plurality of second through holes and the openings. In some embodiments, the conductive material is deposited through atomic layer deposition (ALD), CVD, physical vapor deposition (PVD), plating, or the like. Thereafter, a portion of the conductive material is removed by a mechanical grinding process, a chemical mechanical polishing (CMP) process or the like until the dielectric layer IN9 is exposed. Alternatively, the conductive pattern P3, the conductive patterns P4, the plurality of conductive vias V3 and the plurality of conductive vias V4 may be formed by electroplating, deposition, and/or photolithography and etching. It should be noted that the number of the conductive pattern P3, the number of the conductive patterns P4, the number of the plurality of conductive vias V3 and the number of the plurality of conductive vias V4 illustrated in FIG. 2D are merely for illustrative purposes, and the disclosure is not limited thereto.

Figure 2E:
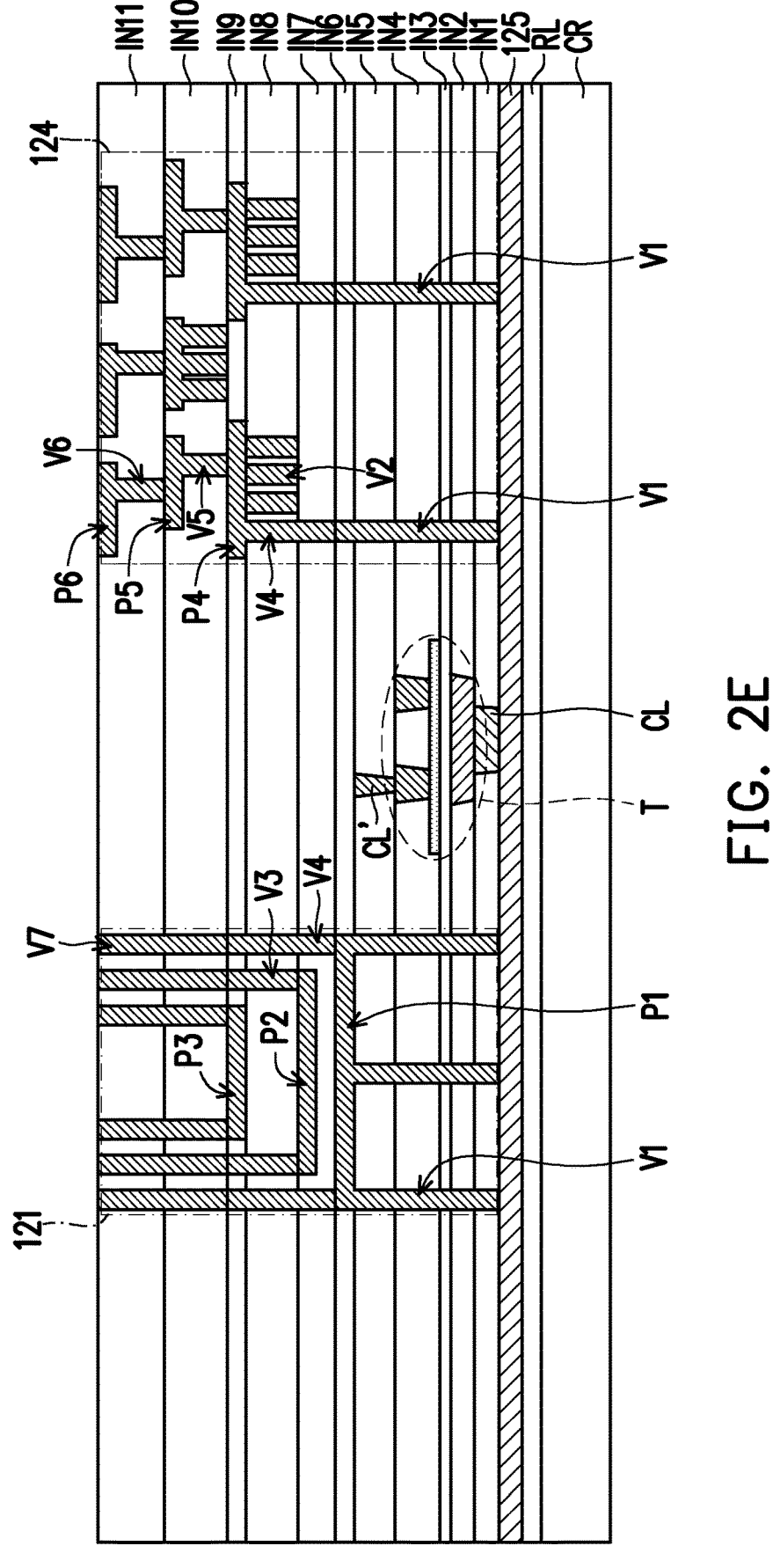

Referring to FIG. 2E, a dielectric layer IN10, conductive patterns P5, a plurality of conductive vias V5, conductive patterns P6, a plurality of conductive vias V6 and a plurality of conductive vias V7 are formed. The dielectric layer IN10 is formed on the dielectric layer IN9, the conductive pattern P3, the conductive patterns P4, the plurality of conductive vias V3 and the plurality of conductive vias V4. The material and formation method of the dielectric layer IN10 are similar to that of the dielectric layer IN1, so the detailed descriptions thereof are omitted herein.

The conductive patterns P5 are embedded in the dielectric layer IN10, while the plurality of conductive vias V5 penetrate through the dielectric layer IN10 and electrically connected to the conductive patterns P5. A portion of the plurality of conductive vias V5 are in contact with and electrically connected to the conductive patterns P4, while the other portion of the plurality of conductive vias V5 are in contact with the dielectric layer IN9.

In some embodiments, a material of the conductive patterns P5 and the plurality of conductive vias V5 includes aluminum, titanium, copper, nickel, tungsten, or alloys thereof. In some embodiments, the conductive patterns P5 and the plurality of conductive vias V51 are formed simultaneously. In some embodiments, the conductive patterns P5 and the plurality of conductive vias V5 are formed by the following steps. The dielectric layer IN10 is patterned through a photolithography process and an etching process to form a plurality of through holes (not shown) to accommodate the plurality of conductive vias V5 subsequently formed thereinto. In addition, the dielectric layer IN10 is patterned through another photolithography process and another etching process to form openings (not shown) in the dielectric layer IN10 to accommodate the conductive patterns P5 subsequently formed thereinto. The plurality of through holes may be formed prior or subsequent to the openings. After the plurality of through holes and the openings are formed, a conductive material (not shown) is deposited on the patterned dielectric layer IN10 to fill up the plurality of through holes and the openings. In some embodiments, the conductive material is deposited through atomic layer deposition (ALD), CVD, physical vapor deposition (PVD), plating, or the like. Thereafter, a portion of the conductive material is removed by a mechanical grinding process, a chemical mechanical polishing (CMP) process or the like until the dielectric layer IN10 is exposed. Alternatively, the conductive patterns P5 and the plurality of conductive vias V5 may be formed by electroplating, deposition, and/or photolithography and etching. It should be noted that the number of the conductive pattern P5 and the number of the conductive vias V5 illustrated in FIG. 2E are merely for illustrative purposes, and the disclosure is not limited thereto.

The dielectric layer IN11 is formed on the dielectric layer IN10, the conductive patterns P5 and the plurality of conductive vias V5. The material and formation method of the dielectric layer IN11 are similar to that of the dielectric layer IN1, so the detailed descriptions thereof are omitted herein.

The conductive patterns P6 are embedded in the dielectric layer IN11 and over the conductive patterns P5, while the plurality of conductive vias V6 penetrate through the dielectric layer IN11 and electrically connected to the conductive patterns P5 and the conductive patterns P6. The plurality of conductive vias V7 penetrate through the dielectric layer IN11 and the dielectric layer IN10 and electrically connected to the conductive pattern P3, the plurality of conductive vias V3 and the plurality of conductive vias V4, respectively.

In some embodiments, a material of the conductive patterns P5, the plurality of conductive vias V6 and the plurality of conductive vias V7 includes aluminum, titanium, copper, nickel, tungsten, or alloys thereof. In some embodiments, the conductive patterns P5, the plurality of conductive vias V6 and the plurality of conductive vias V7 are formed by the following steps. The dielectric layer IN11 and the dielectric layer IN10 are patterned through a photolithography process and an etching process to form a plurality of first through holes (not shown) to accommodate the plurality of conductive vias V7 subsequently formed thereinto. In addition, the dielectric layer IN11 is patterned through another photolithography process and another etching process to form a plurality of second through holes (not shown) to accommodate the plurality of conductive vias V6 subsequently formed thereinto. Moreover, the dielectric layer IN11 is patterned through yet another photolithography process and yet another etching process to form openings (not shown) in the dielectric layer IN11 to accommodate the conductive patterns P6 subsequently formed thereinto. The order in which the plurality of first through holes, the plurality of second through holes and the openings are formed is not limited. Then, a conductive material (not shown) is deposited on the patterned dielectric layer IN11 to fill up the plurality of first through holes, the plurality of second through holes and the openings. In some embodiments, the conductive material is deposited through atomic layer deposition (ALD), CVD, physical vapor deposition (PVD), plating, or the like. Thereafter, a portion of the conductive material is removed by a mechanical grinding process, a chemical mechanical polishing (CMP) process or the like until the dielectric layer IN11 is exposed. Alternatively, the conductive patterns P5, the plurality of conductive vias V6 and the plurality of conductive vias V7 may be formed by electroplating, deposition, and/or photolithography and etching. It should be noted that the number of the conductive patterns P5, the number of the plurality of conductive vias V6 and the number of the plurality of conductive vias V7 illustrated in FIG. 2D are merely for illustrative purposes, and the disclosure is not limited thereto.

After the plurality of conductive vias V7 are formed, the bridge device 121 in FIG. 1 is preliminarily completed. After the plurality of conductive patterns P6 and the plurality of conductive vias V6 are formed, the integrated passive device 124 in FIG. 1 is preliminarily completed. It should be noted that the bridge device 121 and the integrated passive device 124 illustrated in FIG. 2E are merely for illustrative purposes, and the disclosure is not limited thereto.

Figure 2F:
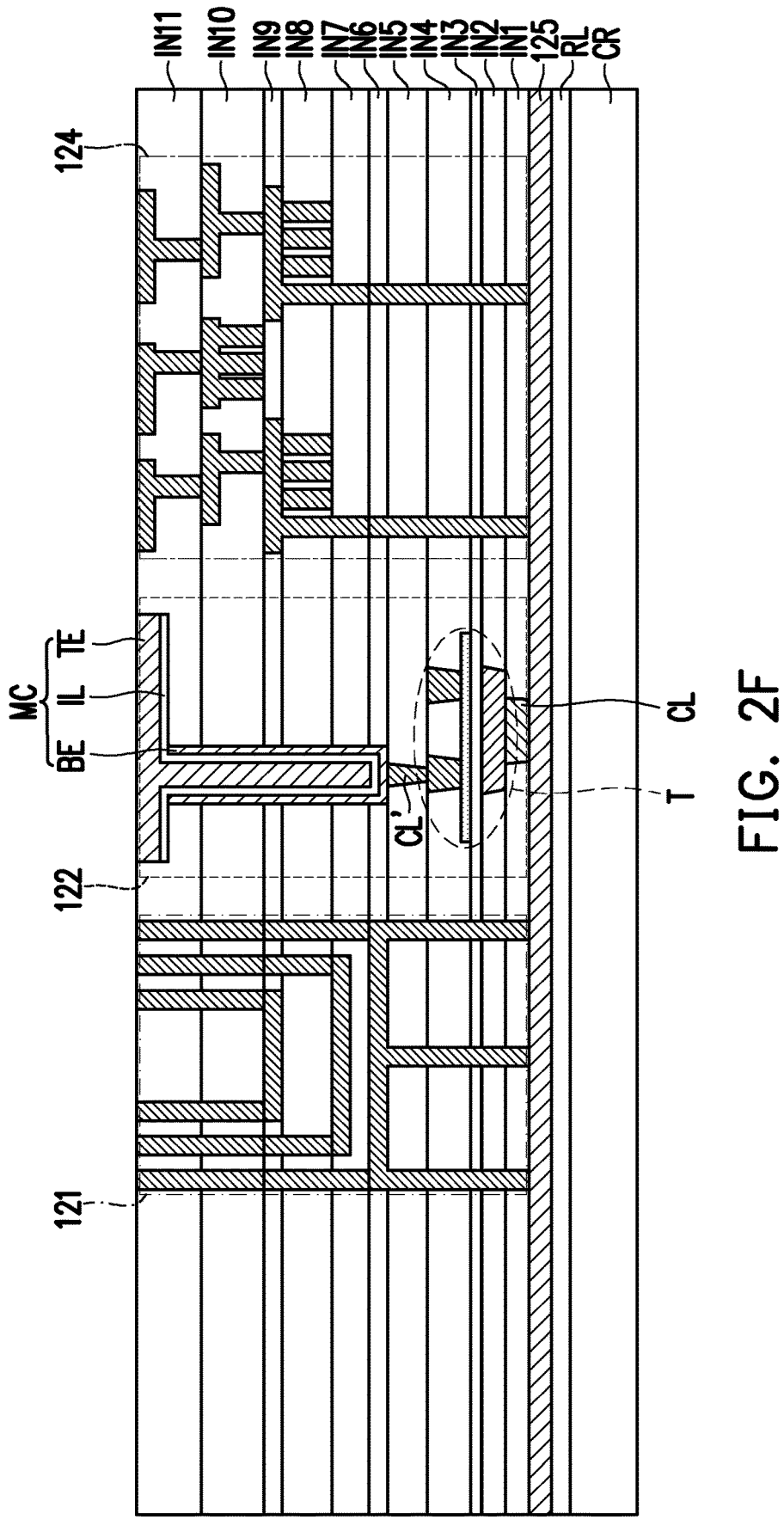

Referring to FIG. 2F, a metal-insulator-metal (MIM) capacitor MC over and electrically connected to the transistor T via the conductive line CL' is formed. The MIM capacitor MC includes a bottom electrode BE, an insulating layer IL and a top electrode TE. In some embodiments, the MIM capacitor MC is formed by the following steps. The dielectric layer IN11, the dielectric layer IN10, the dielectric layer IN9, the dielectric layer IN8, the dielectric layer IN7 and the dielectric layer IN6 are patterned through a photolithography process and an etching process to form a through hole (not shown). In addition, the dielectric layer IN11 is patterned through another photolithography process and another etching process to form an opening (not shown) in the dielectric layer IN11. The order in which the through hole and the opening are formed is not limited. Then, the bottom electrode BE, the insulating layer IL and the top electrode TE are formed in the through hole and the opening.

Material of the bottom electrode BE may include a metallic material (such as silver, aluminum, copper, tungsten, nickel, titanium, tantalum, tungsten, zirconium, hafnium, cobalt, alloys thereof, combinations thereof, or the like), a metal compound (such as titanium nitride, tantalum nitride, metal silicide, combinations thereof, or the like), or the like. In some embodiments, the bottom electrode BE is formed through ALD, CVD, PVD, plating, or the like followed by photolithography and etching.

Material of the insulating layer IL may include a single or composite film of $HfO_2$, $Hr_{1-x}Zr_xO_2$, $ZrO_2$, $TiO_2$, $NiO$, $TaO_x$, $Cu_2O$, $Nb_2O_5$, $Al_2O_3$, $MoO_x$, $CoO$, $ZnO$, $WO_3$, $V_2O_5$, $Fe_3O_4$, $SrZrO_3$, $SrTiO_3$, $Pr_{1-x}Ca_xMnO_3$, $La_{1-x}Ca_xMnO$, or the like. In some embodiments, the insulating layer IL is formed through CVD, PECVD, FCVD, HDP-CVD, SACVD, PVD, or ALD followed by photolithography and etching.

Material of the top electrode TE may include a metallic material (such as silver, aluminum, copper, tungsten, nickel, titanium, tantalum, tungsten, zirconium, hafnium, cobalt, alloys thereof, combinations thereof, or the like), a metal compound (such as titanium nitride, tantalum nitride, metal silicide, combinations thereof, or the like), or the like. In some embodiments, the top electrode TE is formed by the following steps. Frist, a conductive material (not shown) is deposited on the insulating layer IL, the dielectric layer IN11, the bridge device 121 and the integrated passive device 124. In some embodiments, the conductive material is deposited through ALD, CVD, PVD, plating, or the like. Thereafter, a portion of the conductive material is removed until the dielectric layer IN11, the bridge device 121 and the integrated passive device 124 are exposed, so as to form the top electrode TE. In some embodiments, the portion of the conductive material is removed by a mechanical grinding process, a CMP process, or the like. As illustrated in FIG. 2F, a top surface of the top electrode TE may be substantially coplanar with top surfaces of the dielectric layer IN11, the bridge device 121 and the integrated passive device 124.

After the MIM capacitor MC is formed, the memory 122 in FIG. 1 is preliminarily completed. The memory 122 includes, for example, the conductive line CL, the transistor T, the conductive line CL' and the MIM capacitor MC. It should be noted that the memory 122 illustrated in FIG. 2F is merely for illustrative purposes, and the disclosure is not limited thereto. For example, the memory 122 may include more than one transistors and/or more than one capacitors, and the type or structure of the transistor(s) and/or the capacitor(s) can be changed according to actual needs.

Figure 2G:
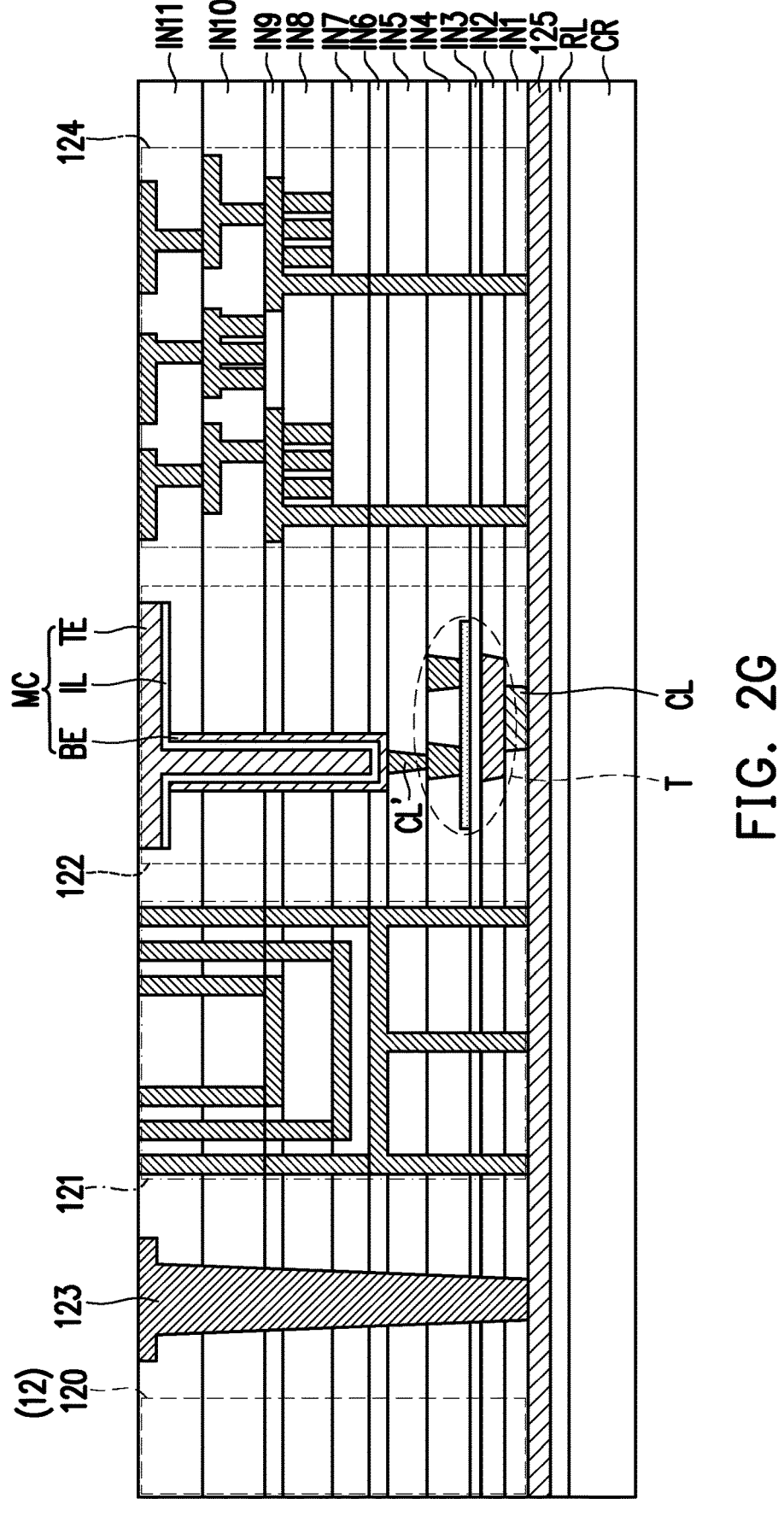

Referring to FIG. 2G, the through substrate via 123 in FIG. 1 is formed. The material and formation method of the through substrate via 123 are similar to that of the conductive pattern P5 and the conductive via V5, so the detailed descriptions thereof are omitted herein.

In some embodiments, as shown in FIG. 2B through FIG. 2G, the substrate 120 of the interposer substrate 12 is formed during the formation of the bridge device 121, the memory 122 and the integrated passive device 124 (if existed). Specifically, the substrate may be a stack of a plurality of dielectric layers, such as the dielectric layer IN1 to dielectric layer IN11. In addition, the bridge device 121, the memory 122, the integrated passive device 124 and the substrate 120 may share the same dielectric layers, such as the dielectric layer IN1 to dielectric layer IN11. However, the disclosure is not limited thereto.

Figure 2H:
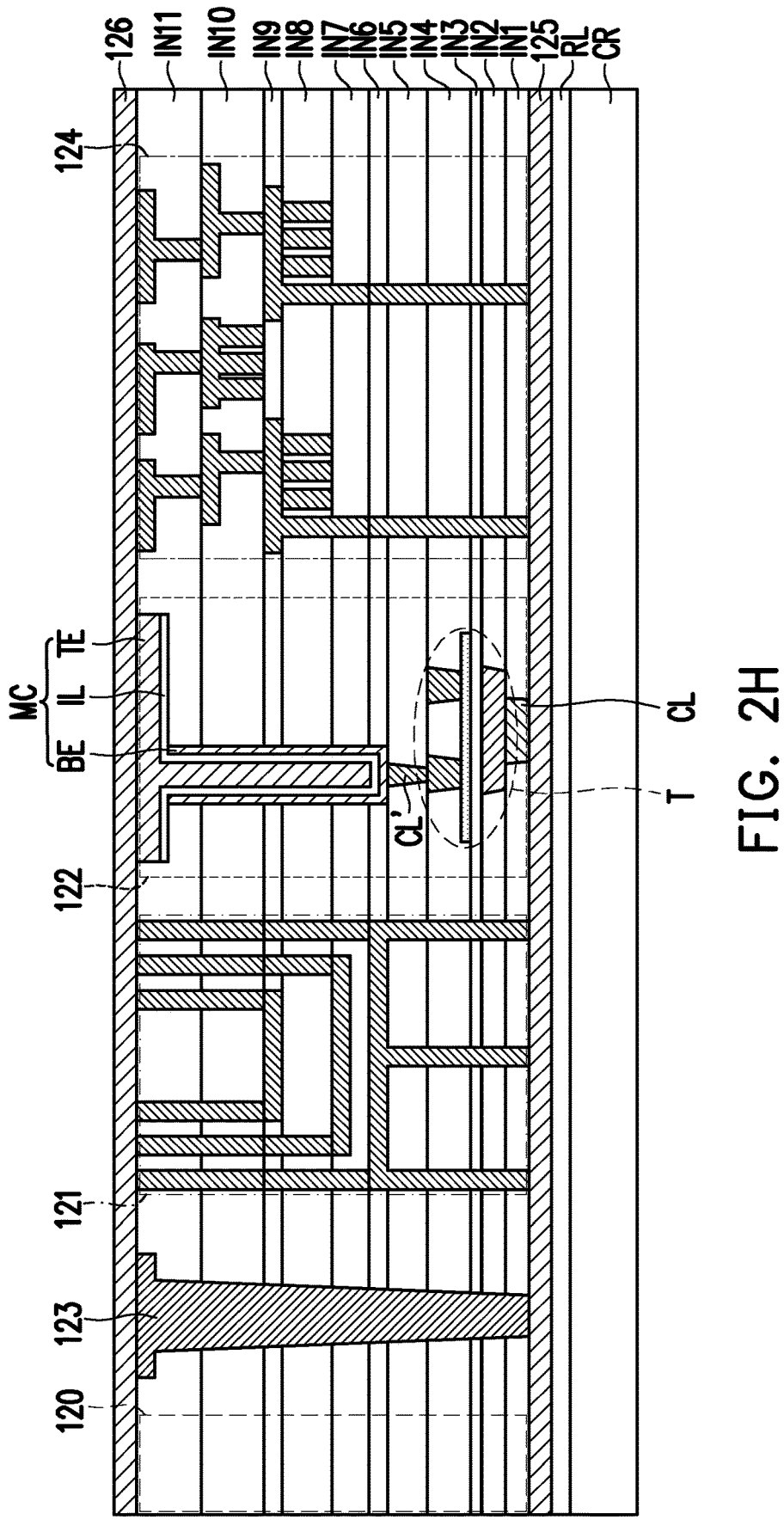

Referring to FIG. 2H, providing the interposer substrate may further include forming the second redistribution circuit structure 126 on the substrate 120, the bridge device 121, the memory 122, the through substrate via 123 and the integrated passive device 124 (if existed). The second redistribution circuit structure 126 may be formed of alternating layers of dielectric (e.g., low-k dielectric material) and conductive material (e.g., copper) with vias interconnecting the layers of conductive material and may be formed through any suitable process (such as deposition, damascene, dual damascene, or the like), as described above. In some embodiments, the material of the wires and the vias includes copper or copper alloy. In some embodiments, the material of the dielectric layers includes silicon oxide, silicon nitride, undoped silicate glass material or a suitable dielectric material.

Although not shown, providing the interposer substrate may further include forming the conductive terminals 128 (see FIG. 1) on the second redistribution circuit structure 126.

Although not shown, providing the interposer substrate may further include detaching the carrier CR from the first redistribution circuit structure 125 after forming the conductive terminals 128 on the second redistribution circuit structure 126. For example, an external energy such as UV laser, visible light or heat, is applied to the release layer RL to lose its adhesiveness, so that the carrier CR may be detached from the first redistribution circuit structure 125. In some embodiments, although not shown, the plurality of semiconductor dies 14 are mounted to the conductive terminals 128 of the interposer substrate 12 before detaching the carrier CR from the first redistribution circuit structure 125.

Although not shown, providing the interposer substrate may further include forming the conductive terminals 127 (see FIG. 1) under the first redistribution circuit structure 125 after detaching the carrier CR from the first redistribution circuit structure 125. In some embodiments, the interposer substrate 12 (see FIG. 1) is bonded to the wiring substrate 10 via the conductive terminals 127 after forming the conductive terminals 127 under the first redistribution circuit structure 125.

In some embodiments, although not shown, a singulation process may be selectively performed to the interposer substrate (e.g., wafer-form interposer substrate) before bonding the interposer substrate 12 to the wiring substrate 10. For example, the wafer-form interposer substrate to which the plurality of semiconductor dies 14 are mounted is attached to a tape frame (not shown) which holds the wafer-form interposer substrate in place during the singulation process. Subsequently, a cutting or singulation process may be performed on the wafer-form interposer substrate. For example, a mechanical saw (e.g., a blade saw), laser saw, or other suitable tool is used to cut across the wafer-form interposer substrate along scribe lines (not shown; e.g., a series of cross lines along directions X and Y), so that several interposer substrates 12 (e.g., chip-form interposer substrate; FIG. 1 schematically illustrates one interposer substrate 12) are separated, or singulated, from each other.

Referring to FIG. 3A through FIG. 3E, cross-sectional views of a process flow for manufacturing a package structure 1A in accordance with some embodiments of the present disclosure is provided.

Figure 3A:
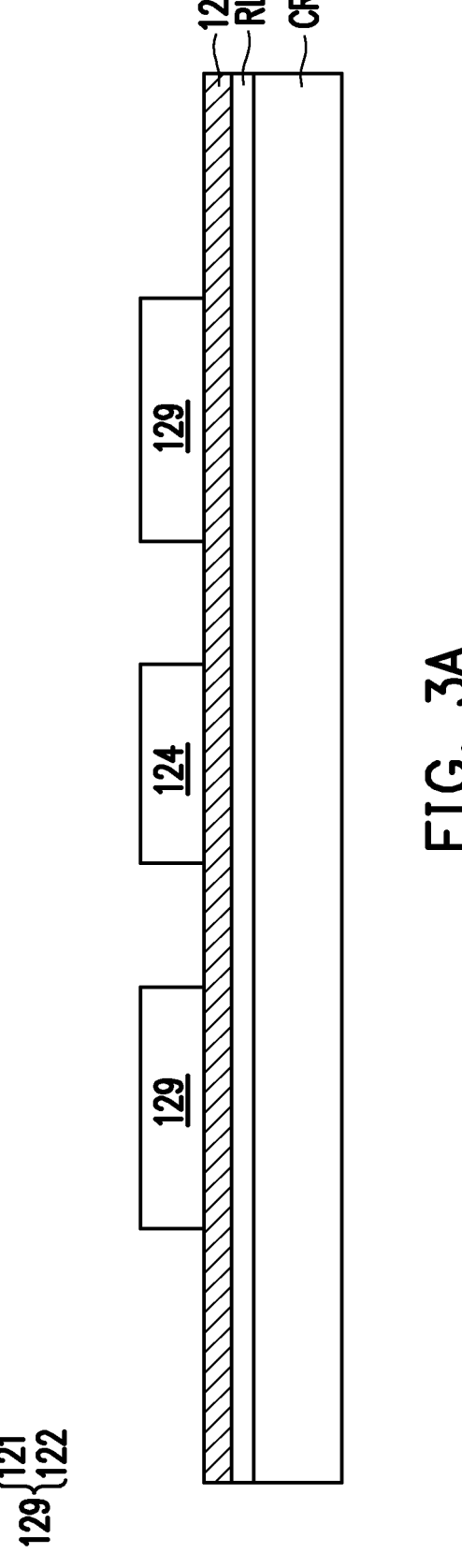
FIG. 3A through FIG. 3E schematically illustrate another process flow for manufacturing a package structure in accordance with some alternative embodiments of the present disclosure.
Figure 4A:
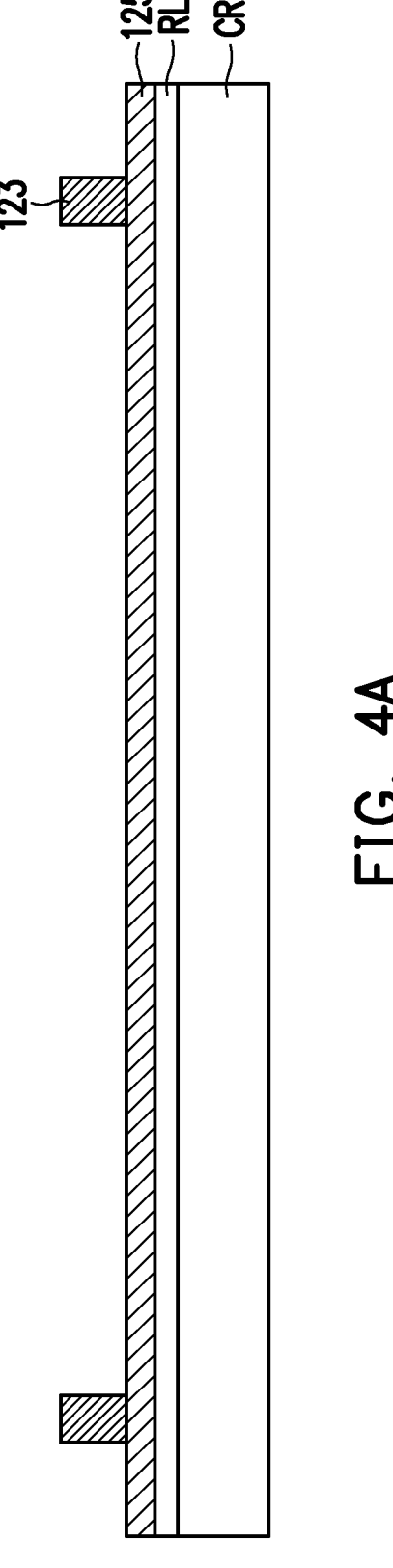
FIG. 4A through FIG. 4C schematically illustrate yet another partial process flow for manufacturing a package structure in accordance with other alternative embodiments of the present disclosure.
Figure 4B:
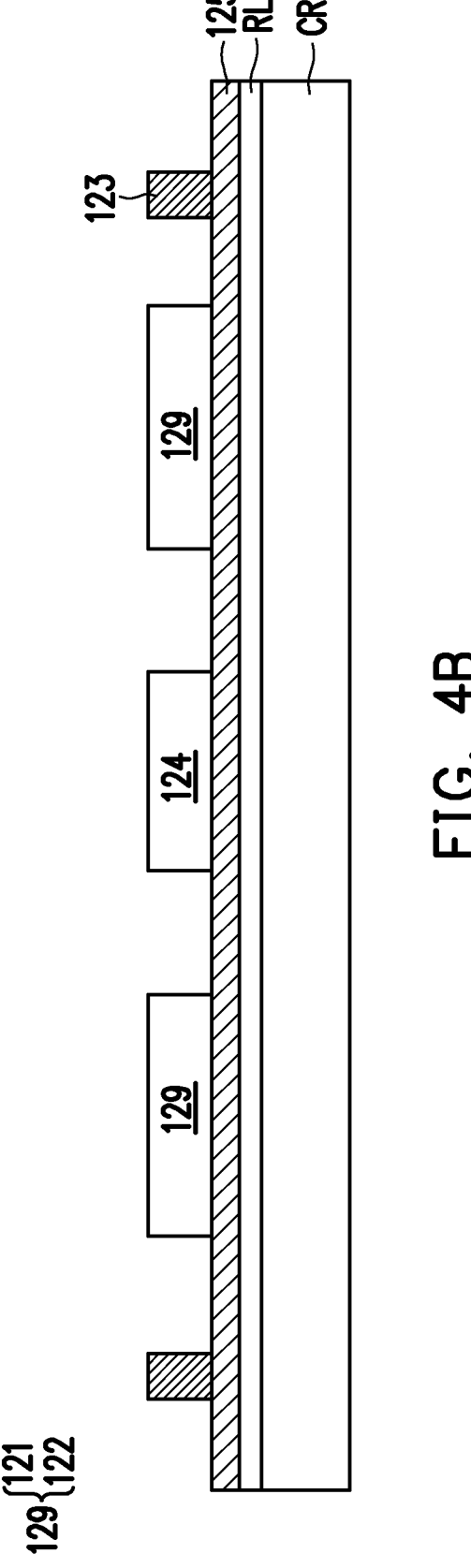
Figure 4C:
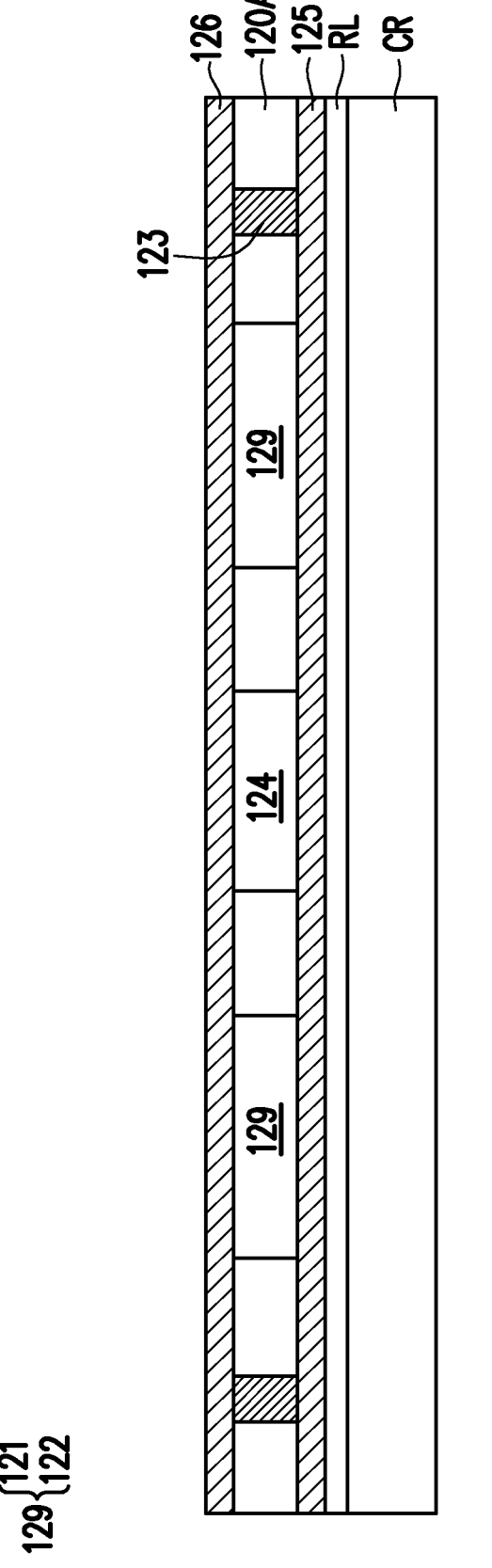

Referring to FIG. 3A, the bridge device 121, the memory 122 and the integrated passive device 124 (if existed) may include at least one die. For example, the bridge device 121 and the memory 122 may be in a single die 129 independent of the die of the integrated passive device 124. Alternatively, the bridge device 121, the memory 122 and the integrated passive device 124 are individual dies singulated from the same wafer or different wafers.

The die 129 of the bridge device 121 and the memory 122 and the die of the integrated passive device 124 are placed on and electrically connected to the first redistribution circuit structure 125 that is temporarily fixed on the carrier CR via the release layer RL. For example, the die 129 of the bridge device 121 and the memory 122 and the die of the integrated passive device 124 may be placed on the first redistribution circuit structure 125 through a pick-and-place method, and then the dies (including the die 129 of the bridge device 121 and the memory 122 and the die of the integrated passive device 124) may be bonded to the first redistribution circuit structure 125 through a bonding process. In some embodiments, the bonding conductors (not shown) of the dies and the bonding conductors (not shown) of the first redistribution circuit structure 125 are bonded to each other via metal-to-metal bonding, and the bonding dielectric layer (not shown) of the dies and the bonding dielectric layer (not shown) of the first redistribution circuit structure 125 are bonded to each other via dielectric-to-dielectric fusion bonding. In some alternative embodiments, although not shown, the dies are bonded to the first redistribution circuit structure 125 using conductive terminals such as metal pillars, micro bumps or combinations thereof, and an underfill may be provided by capillary underfill filling (CUF) to fill the interstices between the dies and the first redistribution circuit structure 125 so as to protect the conductive terminals against thermal or physical stresses.

Figure 3B:
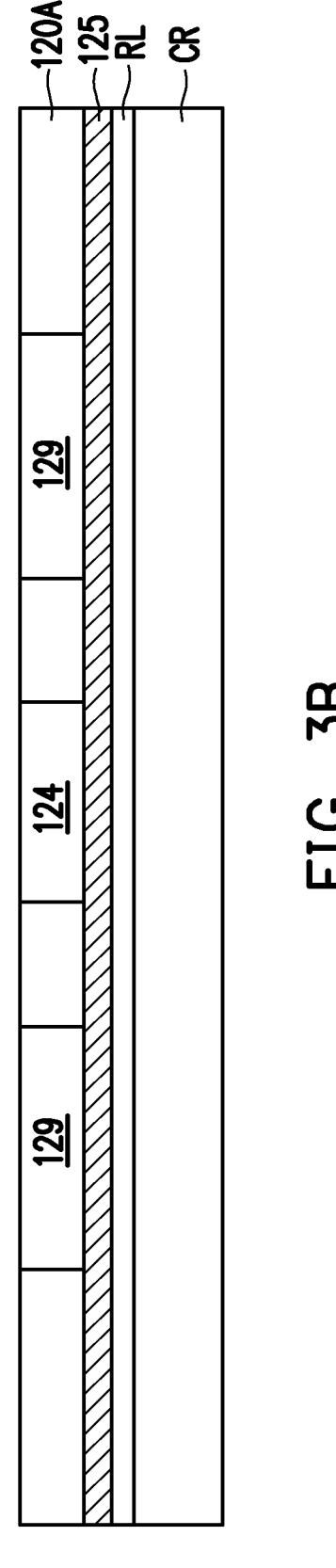

Referring to FIG. 3B, a substrate 120A is formed to laterally encapsulate the dies (including the die 129 of the bridge device 121 and the memory 122 and the die of the integrated passive device 124). For example, an encapsulation material (not shown) is formed over the first redistribution circuit structure 125 to at least encapsulate the dies (including the die 129 of the bridge device 121 and the memory 122 and the die of the integrated passive device 124). In some embodiments, the dies are fully covered and not revealed by the encapsulation material. In some embodiments, the encapsulation material may be a molding compound, a molding underfill, a resin (such as an epoxy resin), a combination thereof or the like. The encapsulation material is then partially removed by the planarization process until the upper surfaces of the dies are exposed. In some embodiments, the planarization of the encapsulation material includes performing a mechanical grinding process and/or a chemical mechanical polishing (CMP) process. After the grinding process or the polishing process, the substrate 120A is formed, wherein upper surfaces of the dies may be substantially coplanar or level with a top surface of the substrate 120A.

Figure 3C:
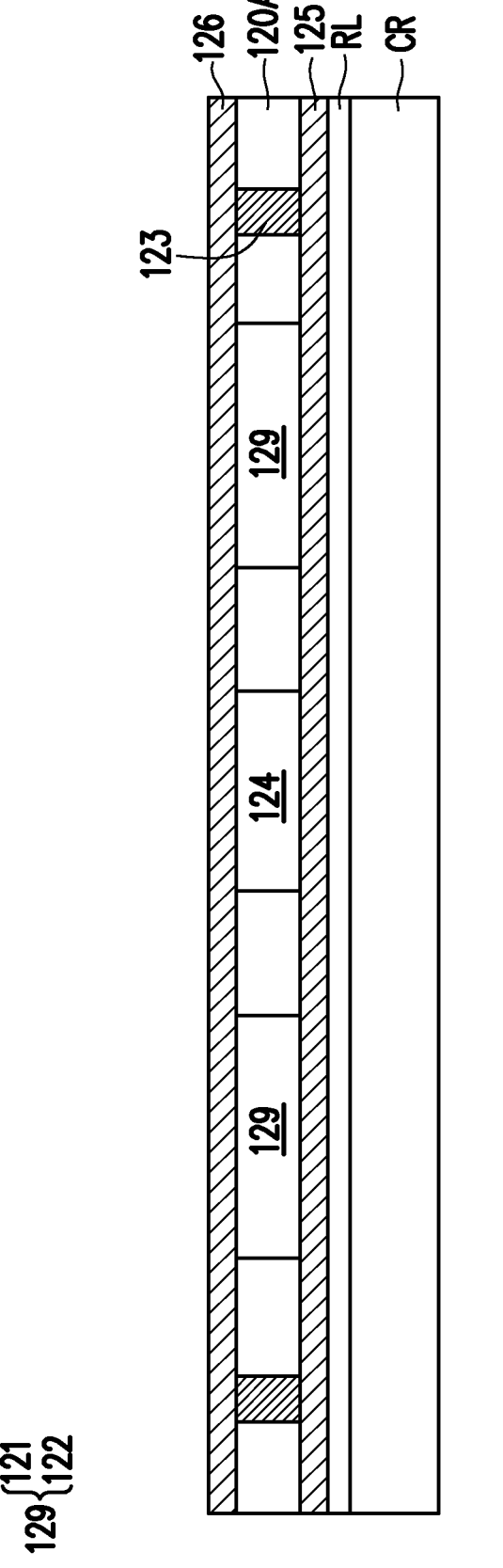

Referring to FIG. 3C, the through substrate via 123 is formed in the substrate 120A by forming a through hole (not shown) in the substrate 120A, and then forming the through substrate via 123 in the through hole. Material and formation method of the through substrate via 123 are similar to that of the conductive line CL, so the detailed descriptions thereof are omitted herein.

After the through substrate via 123 is formed, the second redistribution circuit structure 126 is formed on the substrate 120A, the dies (including the die 129 of the bridge device 121 and the memory 122 and the die of the integrated passive device 124) and the through substrate via 123.

Figure 3D:
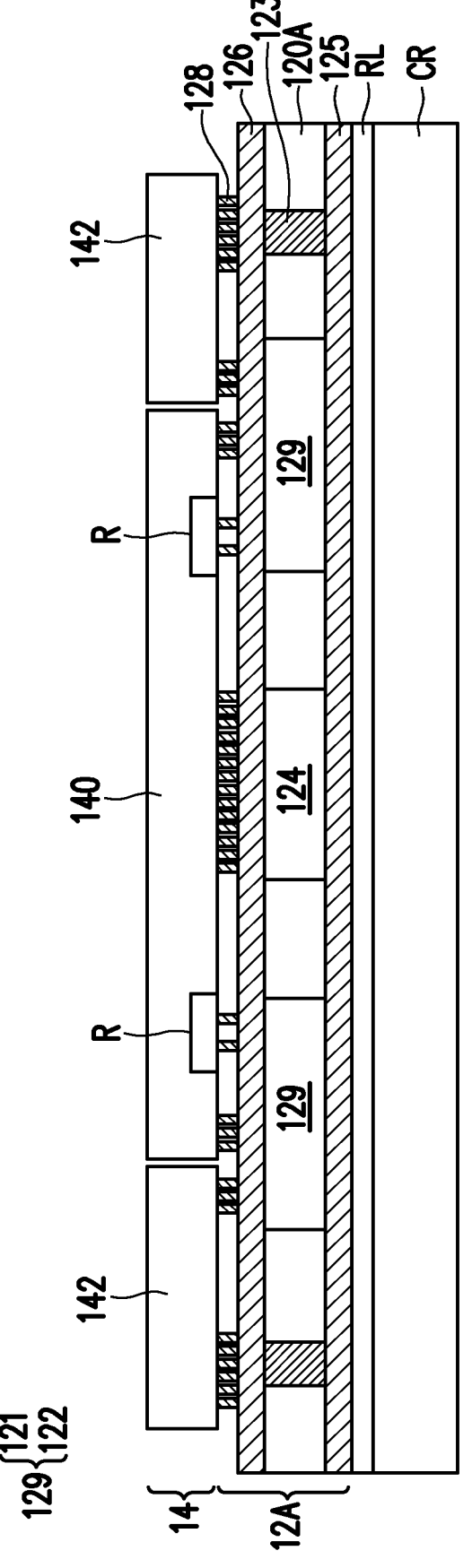

Referring to FIG. 3D, the conductive terminals 128 are formed on the second redistribution circuit structure 126. Then, the plurality of semiconductor dies 14 are mounted to the conductive terminals 128 before detaching the carrier CR from the first redistribution circuit structure 125.

Figure 3E:
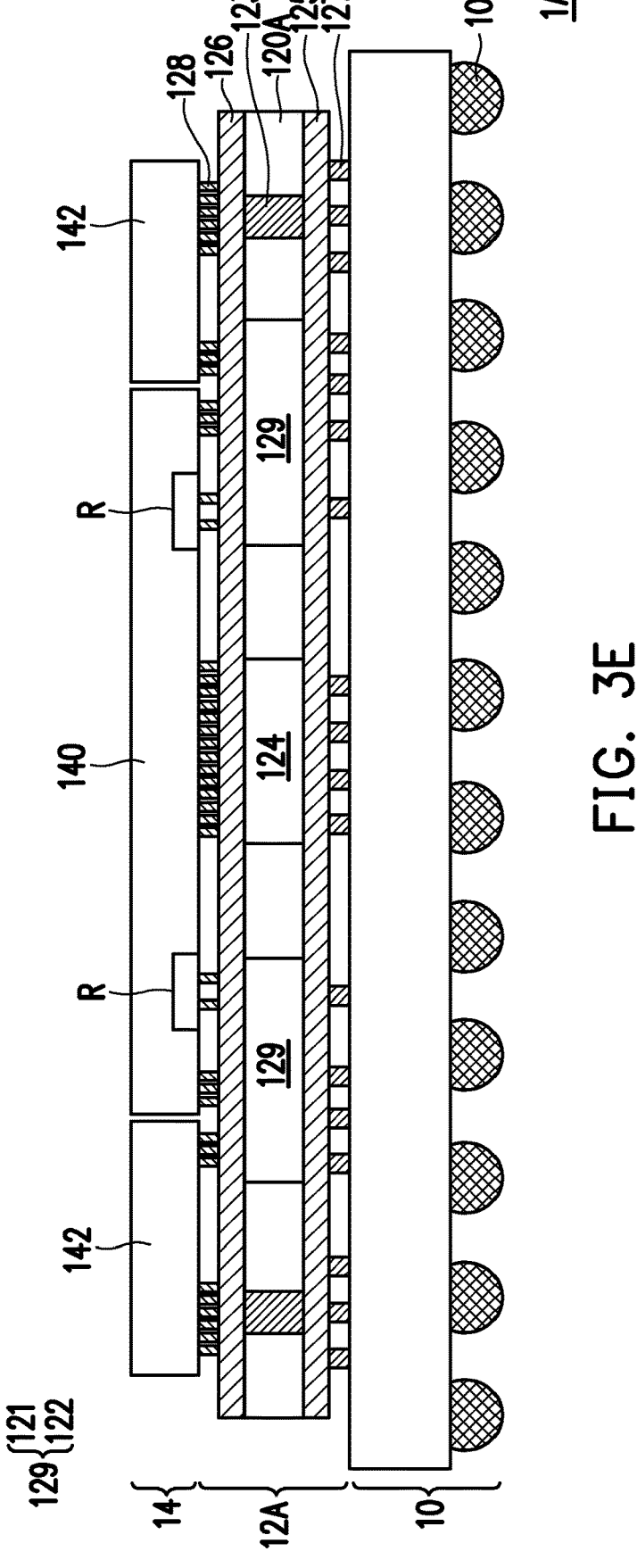

Referring to FIG. 3E, an external energy such as UV laser, visible light or heat, is applied to the release layer RL to lose its adhesiveness, so that the carrier CR may be detached from the first redistribution circuit structure 125.

After the carrier CR is detached from the first redistribution circuit structure 125, the conductive terminals 127 are formed under the first redistribution circuit structure 125. After the conductive terminals 127 are formed, an interposer substrate 12A including the substrate 120A, the dies (including the die 129 of the bridge device 121 and the memory 122 and the die of the integrated passive device 124), the through substrate via 123, the first redistribution circuit structure 125, the second redistribution circuit structure 126, the conductive terminals 127 and the conductive terminals 128 is preliminarily completed.

Then, the interposer substrate 12A is bonded to the wiring substrate 10 via the conductive terminals 127. In some embodiments, although not shown, a singulation process may be selectively performed to the interposer substrate (e.g., wafer-form interposer substrate) before bonding the interposer substrate 12A to the wiring substrate 10. For example, the wafer-form interposer substrate to which the plurality of semiconductor dies 14 are mounted is attached to a tape frame (not shown) which holds the wafer-form interposer substrate in place during the singulation process. Subsequently, a cutting or singulation process may be performed on the wafer-form interposer substrate. For example, a mechanical saw (e.g., a blade saw), laser saw, or other suitable tool is used to cut across the wafer-form interposer substrate along scribe lines (not shown; e.g., a series of cross lines along directions X and Y), so that several interposer substrates 12A (e.g., chip-form interposer substrate; FIG. 3E schematically illustrates one interposer substrate 12A) are separated, or singulated, from each other.

Referring to FIG. 4A through FIG. 4C, cross-sectional views of a partial process flow for manufacturing a package structure (e.g., the package structure 1A in FIG. 3E) in accordance with some embodiments of the present disclosure is provided. Specifically, FIG. 4A through FIG. 4C schematically illustrate alternative steps to FIG. 3A through FIG. 3C.

In some embodiments, as shown in FIG. 4A and FIG. 4B, the through substrate via 123 may be formed on the first redistribution circuit structure 125 prior to placing the dies (including the die 129 of the bridge device 121 and the memory 122 and the die of the integrated passive device 124) on the first redistribution circuit structure 125. The through substrate via 123 may be formed by initially depositing a photoresist (not shown) over the first redistribution circuit structure 125. Once the photoresist has been formed, it may be patterned to form a through hole that exposes a portion of the first redistribution circuit structure 125, on which the through substrate via 123 will subsequently be formed. The patterning of the photoresist may be done by exposing the photoresist in desired location of the through substrate via 123 and developing the photoresist to either remove the exposed portions or the un-exposed portions of the photoresist.

Once the photoresist has been patterned, a conductive material may be formed on the patterned photoresist and inside the through hole. The conductive material may be a material such as copper, titanium, tungsten, aluminum, another metal, the like, or a combination thereof. The conductive material may be formed through a deposition process such as electroplating, electroless plating, or the like. However, while the material and methods discussed are suitable to form the conductive material, these are merely examples. Any other suitable materials or any other suitable processes of formation, such as CVD or PVD, may also be used to form the through substrate via 123. Once the conductive material has been formed, the photoresist may be removed through a suitable removal process such as an ashing process or a chemical stripping process, such as using oxygen plasma or the like.

In some embodiments, as shown in FIG. 4C, the substrate 120A is formed to laterally encapsulate the dies (including the die 129 of the bridge device 121 and the memory 122 and the die of the integrated passive device 124) and the through substrate via 123.

Based on the above discussions, it can be seen that the present disclosure offers various advantages. It is understood, however, that not all advantages are necessarily discussed herein, and other embodiments may offer different advantages, and that no particular advantage is required for all embodiments.

In accordance with some embodiments of the present disclosure, an interposer substrate includes a substrate, a bridge device in the substrate, a memory in the substrate and beside the bridge device and a through substrate via in the substrate and beside the bridge device and the memory. In some embodiments, the substrate, the bridge device, the memory and the through substrate via have the same thickness. In some embodiments, a material of the substrate includes a molding compound, a molding underfill, a resin or a combination thereof, and the bridge device, the memory and the through substrate via are surrounded by the substrate. In some embodiments, a material of the substrate includes a dielectric material, and the substrate is a portion of each of the bridge device and the memory. In some embodiments, the interposer substrate further includes an integrated passive device in the substrate and beside the bridge device, the memory and the through substrate via. In some embodiments, the interposer substrate further includes a first redistribution circuit structure and a second redistribution circuit structure respectively disposed on opposite surfaces of the substrate, wherein the first redistribution circuit structure and the second redistribution circuit structure are electrically connected to the bridge device, the memory and the through substrate via.

In accordance with some embodiments of the present disclosure, a package structure includes a wiring substrate, an interposer substrate bonded and electrically connected to the wiring substrate and a plurality of semiconductor dies bonded and electrically connected to the interposer substrate. The interposer substrate includes a substrate, a bridge device in the substrate, a memory in the substrate and beside the bridge device and a through substrate via in the substrate and beside the bridge device and the memory. In some embodiments, the plurality of semiconductor dies include a system-on-chip die and a memory cube, the memory of the interposer substrate overlaps the system-on-chip die and is electrically connected to the system-on-chip die and the wiring substrate, the bridge device of the interposer substrate overlaps the system-on-chip die and the memory cube and is electrically connected to the system-on-chip die, the memory cube and the wiring substrate, and the system-on-chip die is electrically connected to the memory cube via the bridge device of the interposer substrate. In some embodiments, the substrate, the bridge device, the memory and the through substrate via have the same thickness. In some embodiments, a material of the substrate includes a molding compound, a molding underfill, a resin or a combination thereof, and the bridge device, the memory and the through substrate via are surrounded by the substrate. In some embodiments, a material of the substrate includes a dielectric material, and the substrate is a portion of each of the bridge device and the memory. In some embodiments, the interposer substrate further includes a first redistribution circuit structure disposed on a first surface of the substrate and between the substrate and the wiring substrate and a second redistribution circuit structure disposed on a second surface of the substrate and between the substrate and the plurality of semiconductor dies.

In accordance with alternative embodiments of the present disclosure, a manufacturing method of a package structure includes: providing an interposer substrate that includes a substrate, a bridge device in the substrate, a memory in the substrate and beside the bridge device and a through substrate via in the substrate and beside the bridge device and the memory; bonding a plurality of semiconductor dies to the interposer substrate; and bonding the interposer substrate to a wiring substrate. In some embodiments, the interposer substrate further includes a first redistribution circuit structure and a second redistribution circuit structure respectively disposed on opposite surfaces of the substrate, and providing the interposer substrate includes: forming the first redistribution circuit structure on a carrier; forming the substrate, the bridge device, the memory and the through substrate via on the first redistribution circuit structure; forming the second redistribution circuit structure on the substrate, the bridge device, the memory and the through substrate via; and detaching the carrier from the first redistribution circuit structure. In some embodiments, the carrier is detached from the first redistribution circuit structure after the plurality of semiconductor dies are bonded to the interposer substrate. In some embodiments, the substrate is formed during the formation of the bridge device and the memory, and the substrate is a stack of a plurality of dielectric layers. In some embodiments, the bridge device and the memory include at least one die, and forming the substrate, the bridge device and the memory on the first redistribution circuit structure includes: placing the at least one die on the first redistribution circuit structure; and forming the substrate to laterally encapsulate the at least one die. In some embodiments, a material of the substrate includes a molding compound, a molding underfill, a resin or a combination thereof. In some embodiments, forming the through substrate via on the first redistribution circuit structure includes: forming a through hole in the substrate; and forming the through substrate via in the through hole. In some embodiments, forming the through substrate via on the first redistribution circuit structure includes: forming the through substrate via on the first redistribution circuit structure prior to placing the at least one die on the first redistribution circuit structure; and forming the substrate to laterally encapsulate the at least one die and the through substrate via.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An interposer substrate, comprising:
a substrate;
a bridge device in the substrate;
a memory in the substrate and beside the bridge device, wherein the memory comprises a capacitor, and a top surface of the capacitor is coplanar with a top surface of the substrate;
a through substrate via in the substrate and beside the bridge device and the memory; and
an integrated passive device in the substrate, wherein the memory is on a lateral side of the bridge device that is closer to the integrated passive device.

2. The interposer substrate according to claim 1, wherein the substrate, the bridge device, the memory and the through substrate via have the same thickness.

3. The interposer substrate according to claim 1, wherein:
a material of the substrate comprises a molding compound, a molding underfill, a resin or a combination thereof, and
the bridge device, the memory and the through substrate via are surrounded by the substrate.

4. The interposer substrate according to claim 1, wherein:
a material of the substrate comprises a dielectric material, and
the substrate is a portion of each of the bridge device and the memory.

5. The interposer substrate according to claim 1, further comprising:
a first redistribution circuit structure and a second redistribution circuit structure respectively disposed on opposite surfaces of the substrate,
wherein the first redistribution circuit structure and the second redistribution circuit structure are electrically connected to the bridge device, the memory and the through substrate via.

6. The interposer substrate according to claim 1, wherein the top surface of the substrate is coplanar with a top surface of the bridge device, a top surface of the memory, a top surface of the through substrate via and a top surface of the integrated passive device.

7. A package structure, comprising:
a wiring substrate;
an interposer substrate bonded and electrically connected to the wiring substrate and comprising:
a substrate;
a bridge device in the substrate;
a memory in the substrate and beside the bridge device, wherein the memory comprises a capacitor, and a top surface of the capacitor is coplanar with a top surface of the substrate;
a through substrate via in the substrate and beside the bridge device and the memory; and
an integrated passive device in the substrate, wherein the memory is on a lateral side of the bridge device that is closer to the integrated passive device; and
a plurality of semiconductor dies bonded and electrically connected to the interposer substrate.

8. The package structure according to claim 7, wherein:
the plurality of semiconductor dies comprise a system-on-chip die and a memory cube,
the memory and the integrated passive device overlap the system-on-chip die and are electrically connected to the system-on-chip die and the wiring substrate,
the bridge device overlaps the system-on-chip die and the memory cube and is electrically connected to the system-on-chip die, the memory cube and the wiring substrate, and
the system-on-chip die is electrically connected to the memory cube via the bridge device.

9. The package structure according to claim 7, wherein the substrate, the bridge device, the memory and the through substrate via have the same thickness.

10. The package structure according to claim 7, wherein:
a material of the substrate comprises a molding compound, a molding underfill, a resin or a combination thereof, and
the bridge device, the memory and the through substrate via are surrounded by the substrate.

11. The package structure according to claim 7, wherein:
a material of the substrate comprises a dielectric material, and
the substrate is a portion of each of the bridge device and the memory.

12. The package structure according to claim 7, wherein the interposer substrate further comprises:
a first redistribution circuit structure disposed on a first surface of the substrate and between the substrate and the wiring substrate; and
a second redistribution circuit structure disposed on a second surface of the substrate and between the substrate and the plurality of semiconductor dies.

13. A manufacturing method of a package structure, comprising:
providing an interposer substrate that comprises: a substrate; a bridge device in the substrate; a memory in the substrate and beside the bridge device; a through substrate via in the substrate and beside the bridge device and the memory; and an integrated passive device in the substrate, wherein the memory is on a lateral side of the bridge device that is closer to the integrated passive device, the memory comprises a capacitor, and a top surface of the capacitor is coplanar with a top surface of the substrate;
bonding a plurality of semiconductor dies to the interposer substrate; and
bonding the interposer substrate to a wiring substrate.

14. The manufacturing method of the package structure according to claim 13, wherein the interposer substrate further comprises a first redistribution circuit structure and a second redistribution circuit structure respectively disposed on opposite surfaces of the substrate, and
wherein providing the interposer substrate comprises:
forming the first redistribution circuit structure on a carrier;
forming the substrate, the bridge device, the memory and the through substrate via on the first redistribution circuit structure;
forming the second redistribution circuit structure on the substrate, the bridge device, the memory and the through substrate via; and
detaching the carrier from the first redistribution circuit structure.

15. The manufacturing method of the package structure according to claim 14, wherein the carrier is detached from the first redistribution circuit structure after the plurality of semiconductor dies are bonded to the interposer substrate.

16. The manufacturing method of the package structure according to claim 14, wherein:
the substrate is formed during the formation of the bridge device and the memory, and
the substrate is a stack of a plurality of dielectric layers.

17. The manufacturing method of the package structure according to claim 14, wherein:
the bridge device and the memory comprise at least one die, and
forming the substrate, the bridge device and the memory on the first redistribution circuit structure comprises:
placing the at least one die on the first redistribution circuit structure; and
forming the substrate to laterally encapsulate the at least one die.

18. The manufacturing method of the package structure according to claim 17, wherein a material of the substrate comprises a molding compound, a molding underfill, a resin or a combination thereof.

19. The manufacturing method of the package structure according to claim 17, wherein forming the through substrate via on the first redistribution circuit structure comprises:

forming a through hole in the substrate; and forming the through substrate via in the through hole.

20. The manufacturing method of the package structure according to claim 17, wherein forming the through substrate via on the first redistribution circuit structure comprises:

forming the through substrate via on the first redistribution circuit structure prior to placing the at least one die on the first redistribution circuit structure; and forming the substrate to laterally encapsulate the at least one die and the through substrate via.

* * * * *